(12) United States Patent
Vercesi et al.

(10) Patent No.: US 8,947,139 B1
(45) Date of Patent: Feb. 3, 2015

(54) APPARATUS FOR DOUBLING THE DYNAMIC RANGE OF A TIME TO DIGITAL CONVERTER

(71) Applicant: Marvell International Ltd., Hamilton (BM)

(72) Inventors: Luca Vercesi, Pavia (IT); Rinaldo Castello, Arcore (IT); Fernando De Bernardinis, Pavia (IT)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/170,416

(22) Filed: Jan. 31, 2014

Related U.S. Application Data

(60) Provisional application No. 61/761,459, filed on Feb. 6, 2013.

(51) Int. Cl.
*H03L 7/06* (2006.01)
*G04F 10/00* (2006.01)
*H03L 7/08* (2006.01)

(52) U.S. Cl.
CPC ............... *G04F 10/005* (2013.01); *H03L 7/08* (2013.01)

USPC ............................ 327/158; 327/150; 327/159

(58) Field of Classification Search
None
See application file for complete search history.

(56) References Cited

U.S. PATENT DOCUMENTS

| | | | | |
|---|---|---|---|---|
| 8,618,972 | B1 * | 12/2013 | Na et al. | 341/155 |
| 2011/0084863 | A1 * | 4/2011 | Chiu et al. | 341/141 |
| 2014/0009317 | A1 * | 1/2014 | Na et al. | 341/118 |
| 2014/0104090 | A1 * | 4/2014 | Dosho | 341/166 |
| 2014/0152484 | A1 * | 6/2014 | Dosho et al. | 341/166 |

* cited by examiner

*Primary Examiner* — Ryan Jager

(57) ABSTRACT

An apparatus increases the dynamic range of a time to digital converter. The apparatus includes: an input network configured to receive a first signal, a second signal, and a control signal having a sign value; and a time-to-digital converter (TDC) configured to generate a digital code value that represents a time delay value between the first signal and the second signal. The input network is configured to switch where the first signal and second signal are output in response to the sign value that is determined by the time delay value between the first signal and the second signal.

19 Claims, 10 Drawing Sheets

Digital offset cancellation

Analog offset cancellation

APPARATUS FOR DOUBLING THE DYNAMIC RANGE OF A TIME TO DIGITAL CONVERTER

CROSS-REFERENCE TO RELATED APPLICATIONS

This present disclosure claims the benefit of U.S. Provisional Application No. 61/761,459, entitled "APPARATUS FOR DOUBLING THE DYNAMIC RANGE OF A TIME TO DIGITAL CONVERTER," filed on Feb. 6, 2013, which is incorporated by reference herein in its entirety.

BACKGROUND

A time to digital converter (TDC) is typically used to digitize a time delay value between two different signals. A TDC determines the delay, for example, between a signal edge in a reference signal and a signal edge in an input signal to the TDC. Typically, a TDC will output a digital code value which represents this time delay value between the signals.

A TDC is commonly used in a digital phase-locked loop (PLL). PLLs are used, for example, to lock the phase difference between the two different signals, and this locking will result in the input and output frequencies of a PLL to be the same or synchronized. PLLs can also generate a frequency that is a multiple of the input frequency. PLLs are widely used in, for example, radio, telecommunications, computers, and other applications.

SUMMARY

In an embodiment of the disclosure, a method increases the dynamic range of a time to digital converter. The method includes: receiving a first signal, a second signal, and a control signal having a sign value; generating a digital code value that represents a time delay value between the first signal and the second signal; and switching and outputting the first signal and second signal in response to the sign value that is determined by the time delay value between the first signal and the second signal.

In an embodiment of the disclosure, the switching comprises: coupling a first input signal path that transmits the first signal to a first switch and coupling a second input signal path that transmits the second signal to a second switch if the sign value is at a first value, and coupling the first input signal path to the second switch and coupling the second input signal path to the first switch if the sign value is at a second value.

In an embodiment of the disclosure, the digital code value is generated using a time to digital converter (TDC), with the TDC including a first signal path, a second signal path, a plurality of delay elements coupled to the first signal path, and a plurality of memory elements coupled to the first signal path and to the second signal path.

In an embodiment of the disclosure, the method further comprises: transmitting the first signal to a first signal path of the TDC if the sign value is at a first value and transmitting the second signal to a second signal path of the TDC if the sign value is at the first value; and transmitting the second signal to the first signal path if the sign value is at a second value and transmitting the first signal to the second signal path if the sign value is at the second value.

In an embodiment of the disclosure, the digital code value represents the time delay value between the first signal and the second signal and the digital code value is used to maintain the time delay value below a threshold value in a PLL.

In an embodiment of the disclosure, the PLL is a fractional PLL, and the sign value is determined using a fractional error of the fractional PLL.

In an embodiment of the disclosure, the method further comprises providing an offset calibration signal to a digital adder and reducing the offset by adding the offset calibration signal to the digital code value. The offset calibration signal is proportional to an offset in the digital code value.

In an embodiment of the disclosure, an apparatus increases the dynamic range of a time to digital converter. The apparatus includes: an input network configured to receive a first signal, a second signal, and a control signal having a sign value; and a TDC configured to generate a digital code value that represents a time delay value between the first signal and the second signal. The input network is configured to switch where the first signal and second signal are output in response to the sign value that is determined by the time delay value between the first signal and the second signal.

In an embodiment of the disclosure, the input network comprises a first input signal path transmitting the first signal, a second input signal path transmitting the second signal, a first switch, and a second switch, and the first switch is coupled to the first input signal path and the second switch is coupled to the second input signal path if the sign value is at a first value, and the first switch is coupled to the second input signal path and the second switch is coupled to the first input signal path if the sign value is at a second value.

In an embodiment of the disclosure, the TDC comprises a first signal path, a second signal path, a plurality of delay elements coupled to the first signal path, and a plurality of memory elements coupled to the first signal path and to the second signal path.

In an embodiment of the disclosure, the apparatus is a phase-locked loop circuit (PLL).

In an embodiment of the disclosure, the apparatus further comprises: an offset calibration block coupled to an output of the TDC and configured to provide an offset calibration signal to a digital adder; and the digital adder coupled to the output of the TDC and to the offset calibration block. The digital adder is configured to reduce an offset in the digital code value.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1A:
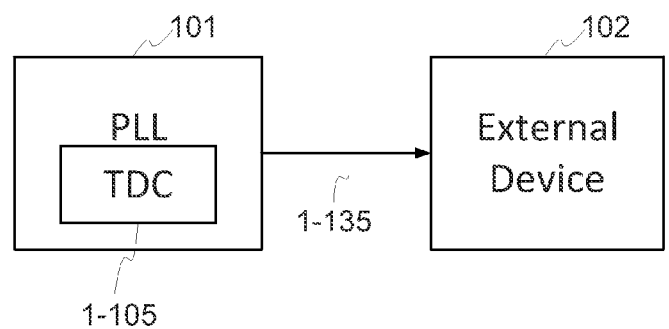
FIGS. 1A and 1B illustrate block diagrams of a system including a digital phase-locked loop (PLL) and the PLL, respectively, in accordance with an embodiment.

FIG. 1A illustrates a block diagram of a system 100 including digital phase-locked loop (PLL) 101 according to an embodiment. The PLL 101 generates an oscillatory output signal 1-135 at a desired frequency and provides the output signal 1-135 to an external device 102.

Figure 1B:
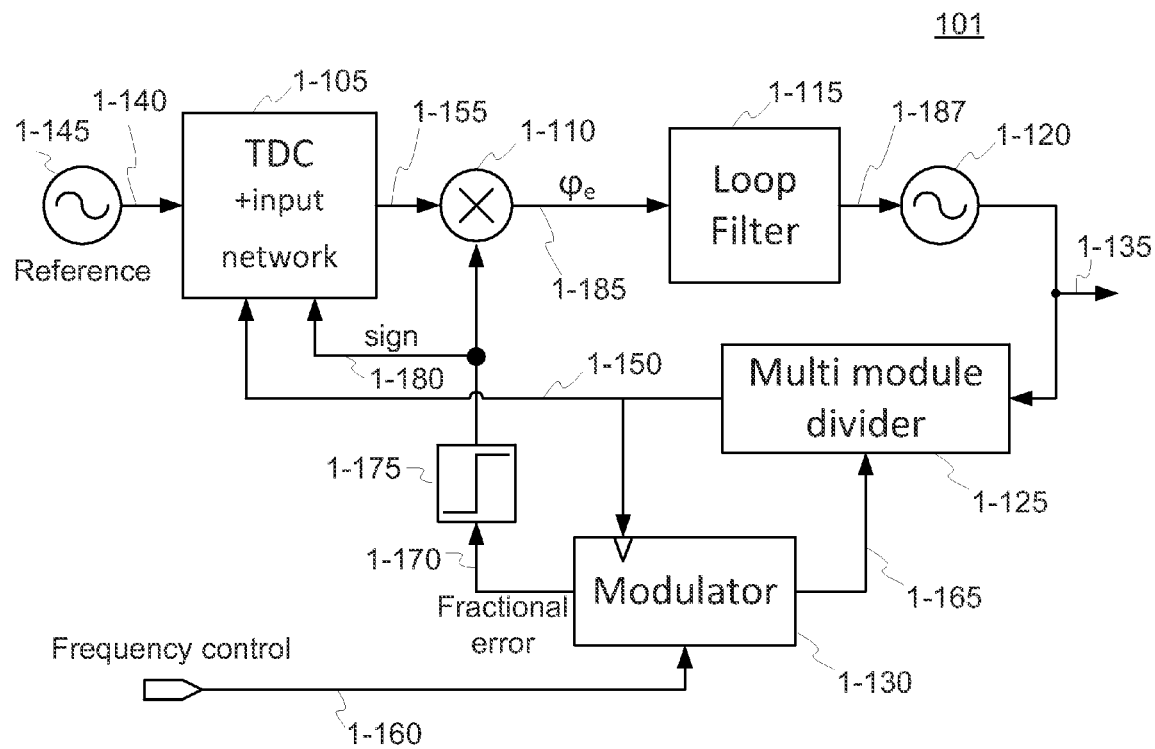

FIG. 1B illustrates a block diagram of the PLL shown in FIG. 1A according to an embodiment. The PLL 101 is, for example, a fractional digital PLL. Fractional digital PLLs operate by periodically changing the division ratio from N to N+1 and then back from N+1 to N such that the average division ratio is N+$\alpha$, where $0 \leq \alpha < 1$. For example, if N is 5 for 99 cycles and 6 for one cycle, then the average division ratio is approximately 5.01 (=5*99/100+6*1/100).

In an embodiment, the PLL 101 includes a time to digital converter (TDC) block 1-105, a digital multiplier 1-110, a digital loop filter 1-115, a digitally controlled oscillator (DCO) 1-120, a multi module divider 1-125, and a modulator 1-130. As will be discussed below, the TDC block 1-105 includes a time to digital converter (TDC) 305 (FIG. 3) and an input network 310 (FIG. 3), according to an embodiment of the disclosure. As will be discussed below, the input network 310 permits the TDC 305 to detect positive and negative delay values between two input signals to the TDC block 1-105. In an embodiment, the dynamic range of the TDC 305 is increased by a factor of about 2 while maintaining power and area consumption substantially the same by using the detected positive and negative delay values.

The PLL 101 can generate (via the DCO 1-120) an oscillatory output signal ("LO out" signal) 1-135 at a desired frequency in response to a reference signal 1-140 from a reference signal source 1-145. In an embodiment, the reference signal source 1-145 is an external signal source. The PLL 101 may, for example, operate as a phase-locked loop in which a time difference (or phase difference) between the reference signal 1-140 ("first signal 1-140") and a frequency-divided feedback signal 1-150 ("divider out signal 1-150" or "second signal 1-150") generates a digital code value 1-155 which represents a time delay value between the signal edges of the oscillatory output signal 1-135 and the reference signal 1-140. The DCO 1-120 transmits the oscillatory output signal 1-135 to the external device(s) 102 (FIG. 1A) and to the multi module divider 1-125.

The TDC block 1-105 receives the reference signal 1-140 from the reference signal source 1-145 and the frequency-divided feedback signal 1-150 from the multi module divider 1-125. The TDC block 1-105 generates the digital code value 1-155 which represents a time delay value between the reference signal 1-140 and the frequency-divided signal 1-150. As will be described below further, the TDC block 1-105 produces the delay code value 1-155 that increases linearly over a range of time differences that is known as a "dynamic range". In an embodiment of the disclosure, this dynamic range includes positive delay values and negative delay values between two signals. As stated above, if a reference signal is lagging the input signal to the TDC in phase, then there is a positive delay between the reference signal and the input signal, and if the reference signal is leading the input signal in phase, then there is a negative delay between the reference signal and the input signal.

In one common application of a PLL, if the time delay value between the reference signal 1-140 and the frequency-divided signal 1-150 drifts beyond a desired threshold or range, the digital delay code value 1-155 will increase or indicate an increased error, then the loop filter 1-115 will drive the DCO 1-120 to change the frequency of the oscillatory output signal 1-135 such that the time delay is reduced. Thus, the output phase is locked to the phase at the input of the PLL 101.

Fractional digital PLLs are affected by deterministic disturbances which are known as "fractional errors". These fractional errors occur due to the switching of the division ratio from N to N+1 and back from N+1 to N. This switching results in a sawtooth-like waveform on the input line to the DCO 1-120 and frequency modulation (FM) sidebands on the oscillatory output signal 1-135. In a fractional PLL, the phase error is composed of fractional errors and jitter (noise on the waveform). The value of fractional errors is typically larger than the value of jitter in a fractional digital PLL. However, since fractional errors are deterministic, these errors can be predicted. The modulator 1-130 generates a fractional error signal 1-170, which indicates a predicted phase difference between the reference signal 1-140 and the frequency-divided feedback signal 1-150. Based on whether the fractional error signal 1-140 is indicating an edge of the frequency-divided feedback signal 1-150 (Divider out signal) is leading or lagging an edge of the reference signal 1-140, the module 1-175 (or sign generator) assigns and generates a sign value corresponding to a positive value (e.g., "+1") or a negative value (e.g., "−1"). As will be discussed in FIG. 2 below, if the fractional error 1-170 is a negative value, then the sign value 1-180 will be −1. If the fractional error 1-170 is a positive value, then the sign value 1-180 will be a −1.

The TDC block 1-105 and the multiplier 1-110 receives the sign value 1-180. As will be discussed below, the sign value 1-180 is used as a control signal that controls the switching of switches in the input network of the TDC block 1-105.

The digital multiplier 1-110 generates a modified timing error value 1-185 (or modified time delay code value 1-185) which is product of the digital code value 1-155 and the sign value 1-180.

The digital loop filter 1-115 shapes the time domain or frequency domain characteristics of the modified time delay code value 1-185 from the digital multiplier 1-110. For example, the digital loop filter 1-115 is a low-pass filter. Additionally or alternatively, as another example, the digital loop filter 1-115 may impose a critically damped loop characteristic on the PLL 101. A critically damped loop can exhibit a loop damping factor of, for example, approximately 0.7.

The DCO 1-120 can oscillate based on and in response to the digitally filtered output signal 1-187 from the digital loop filter 1-115. For example, the frequency of oscillation of the DCO 1-120 may be proportional to the digitally filtered output signal 1-187 from the digital loop filter 1-115. The DCO output signal 1-135 may oscillate at a frequency that is an integer or non-integer multiple of the reference signal frequency of the reference signal 1-140. The output frequency of the DCO 1-120 may be determined by the average division factor of the divider 1-125.

The modulator 1-130 may, in response to the frequency control signal 1-160, adjust the division factor of the multi module divider 1-125. For example, the modulator 1-130 may toggle the feedback division factor between two integer values of N and N+1. The modulator 1-130 may modify the toggle rate and toggle signal phase, with respect to the reference signal 1-140, in order to tune the frequency of the DCO 1-120. As a result, the PLL 101 may operate as a frequency synthesizer that generates an output signal 1-135 that has a frequency that is equal to or higher than the frequency of the reference signal 1-140.

Based on a frequency control signal 1-160, the modulator 1-130 can set a proper oscillation frequency for the oscillatory output signal 1-135 by determining a sequence of N/N+1 divisions and generates a toggle control signal 165 which represents the sequence of N/N+1 divisions. In response to a feedback of the output signal 1-135 and a toggle control signal 165 from the modulator 1-130, the multi module divider 1-125 generates a frequency-divided feedback signal 1-150 (or divider out signal 1-150) to the TDC block 1-105. The TDC block 1-105 will then process and perform a comparison of the delay between the edges of the reference signal 1-140 and the frequency-divided feedback signal 1-150, and will generate a digital code value 1-155 ("delay value code 1-155") based on the comparison of the delay between the edges of the reference signal 1-140 and the frequency-divided feedback signal 1-150. An edge of the frequency-divided feedback signal 1-150 corresponds to an edge of the oscillatory output signal 1-135.

The multi module divider 1-125 also outputs the frequency-divided feedback signal 1-150 to the modulator 1-130 to permit the modulator 1-130 to increase or decrease the sequence N/N+1 divisions on the oscillatory output signal (LO out signal) 1-135 in response to the frequency control signal 1-160.

Figure 2:
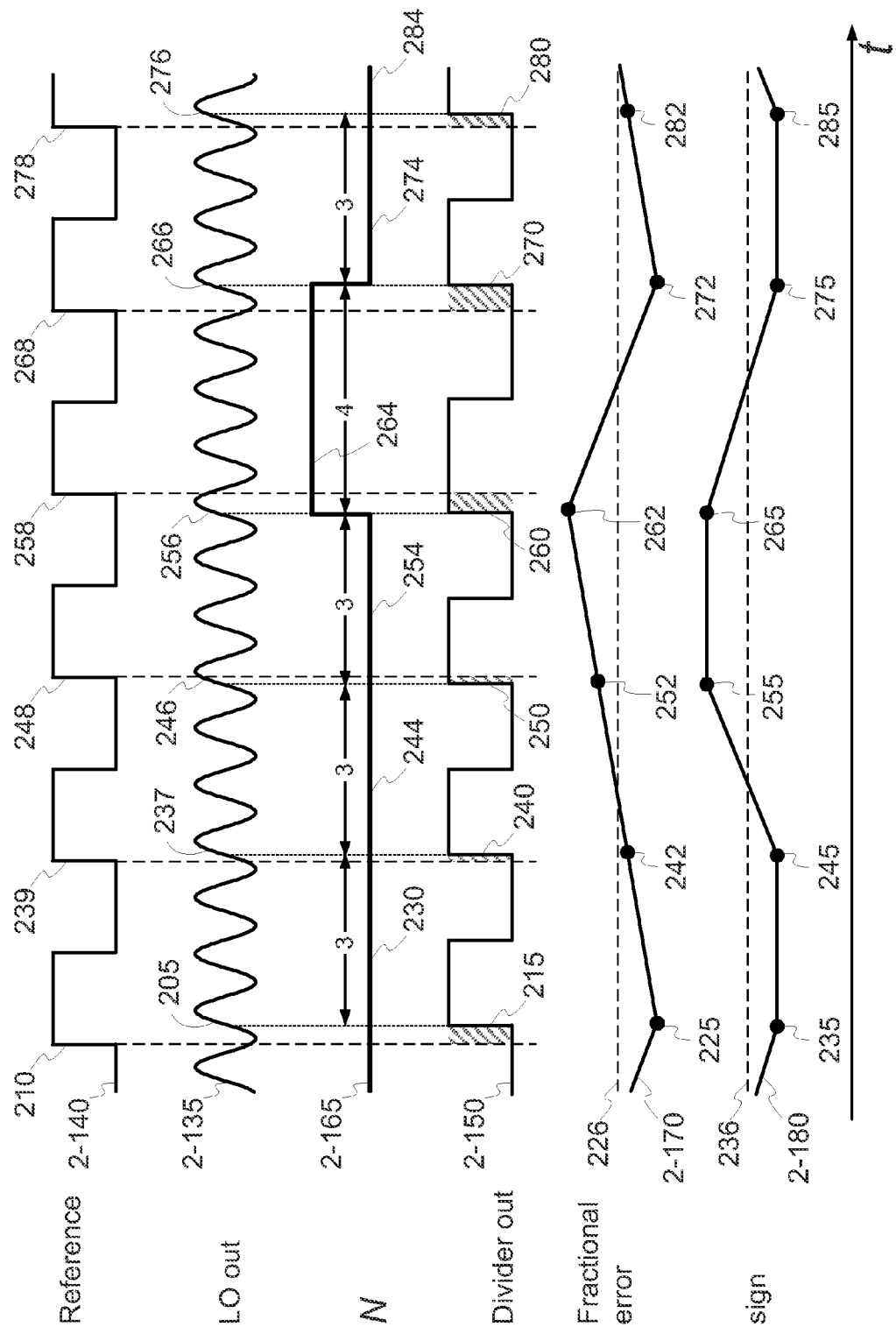
FIG. 2 illustrates waveform diagrams of signals that are processed in the digital PLL of FIGS. 1A and 1B according to an embodiment.

FIG. 2 illustrates waveform diagrams of signals that are processed in the digital PLL 101 of FIG. 1B according to an embodiment of the disclosure. The reference signal 2-140, oscillatory output signal (LO out signal) 2-135, toggle control signal 2-165, frequency-divided feedback signal (divider out signal) 2-150, fractional error signal 2-170, and sign value signal 2-180 correspond to the reference signal 1-140, oscillatory output signal 1-135, toggle control signal (N) 1-165, frequency-divided feedback signal 1-150, fractional error signal 1-170, and sign value signal 1-180, respectively, as discussed above with reference to FIG. 1B.

As an example, when an edge 205 of the oscillatory output signal 2-135 is lagging an edge 210 of the reference signal 2-140, then an edge 215 of the frequency-divided feedback signal 2-150 will also lag the edge 210. A fractional error signal 2-170 has a first value 225 which is a predicted (deterministic) fractional error value corresponding to the delay between the edges 210 and 215. Since the edge 215 of the frequency-divided feedback signal 2-150 is lagging the edge 210 of the reference signal 2-140, the first fractional error value 225 is negative. A fractional error value may either be a positive fractional error value if that value is above a fractional error reference level 226 (e.g., a zero "0"value) and a negative fractional error value if that value is below the fractional error reference level 226. A sign value (negative value or positive value) in the sign value signal 2-180 is the same as the sign value of an associated (or corresponding) fractional error value in the fractional error signal 2-170. For example, a sign value signal 2-180 has a negative value (e.g., "−1") at a first sign value 235 that corresponds to the first negative fractional error value 225.

An edge 240 of the frequency-divided feedback signal 2-150 slightly lags an edge 239 of the reference signal 2-140. The fractional error signal 2-170 has a second fractional value 242 which is a predicted (deterministic) fractional error value corresponding to the delay between the edges 237 and 239. Since the edge 240 of the frequency-divided feedback signal 2-150 lags the edge 239 of the reference signal 2-140, the second fractional error value 242 is negative. Thus, the sign value signal 2-180 at a second sign value 245 corresponding to the second fractional error value 242 has the same negative value (e.g., "−1") as that at the first sign value 235. However, since the time delay value between the edges 239 and 240 is less that the time delay value between the edges 210 and 215, the absolute value of the second fractional error value 242 is less than that of the first fractional error value 225.

An edge 250 of the frequency-divided feedback signal 2-150 leads an edge 248 of the reference signal 2-140. The fractional error signal 2-170 has a third fractional error value 252 which is a predicted (deterministic) fractional error value corresponding to the delay between the edges 248 and 250. The third fractional error value 252 is positive since the edge 250 of the frequency-divided feedback signal 2-150 is leading the edge 248 of the reference signal 2-140. Thus, the sign value signal 2-180 has a positive value (e.g., "+1") at a third sign value 255 corresponding to the third fractional error value 252.

An edge 260 of the frequency-divided feedback signal 2-150 leads an edge 258 of the reference signal 2-140. The fractional error signal 2-170 has a fourth fractional error value 262 which is a predicted (deterministic) fractional error value corresponding to the delay between the edges 258 and 260. The fourth fractional error value 262 is positive since the edge 260 of the frequency-divided feedback signal 2-150 is leading the edge 258 of the reference signal 2-140. Thus, the sign value signal 2-180 has a positive value (e.g., "+1") at a fourth sign value 265 corresponding to the fourth fractional error value 262. The positive value of the fourth fractional error value 262 is greater than the positive value of the third fractional error value 252 since the time delay value between the edges 258 and 260 is greater that the time delay value between the edges 248 and 250.

During the period of the frequency-divided feedback signal 2-150 between the edges 260 and 270, the toggle control signal 2-165 has changed such that the number of pulses of the oscillatory output signal 2-135 increases from N=3 to N=4 in accordance with an operation of a fractional digital PLL. As a result, an edge 270 of the frequency-divided feedback signal 2-150 lags an edge 268 of the reference signal 2-140 by substantially the same time delay as that between the edge 210 of the reference signal 2-140 and the edge 215 of the frequency-divided feedback signal 2-150. Thus, the fractional error signal 2-170 has a fifth fractional error value 272 that is substantially the same as the first fractional error value 225. The sign value signal 2-180 at a fifth sign value 275 has a negative value as with the first sign value 235.

During the period of the frequency-divided feedback signal 2-150 between the edges 270 and 280, the toggle control signal 2-165 has changed such that the number of pulses of the oscillatory output signal 2-135 decreases from N=4 to N=3 in accordance with an operation of a fractional digital PLL. As a result, an edge 280 of the frequency-divided feedback signal 2-150 lags an edge 228 of the reference signal 2-140 by substantially the same time delay as that between the edge 239 of the reference signal 2-140 and the edge 240 of the frequency-divided feedback signal 2-150. Thus, the fractional error signal 2-170 has a sixth fractional error value 282 that is substantially the same as the second fractional error value 242. The sign value signal 2-180 at a sixth sign value 285 has a negative value as with the second sign value 245.

Figure 3:
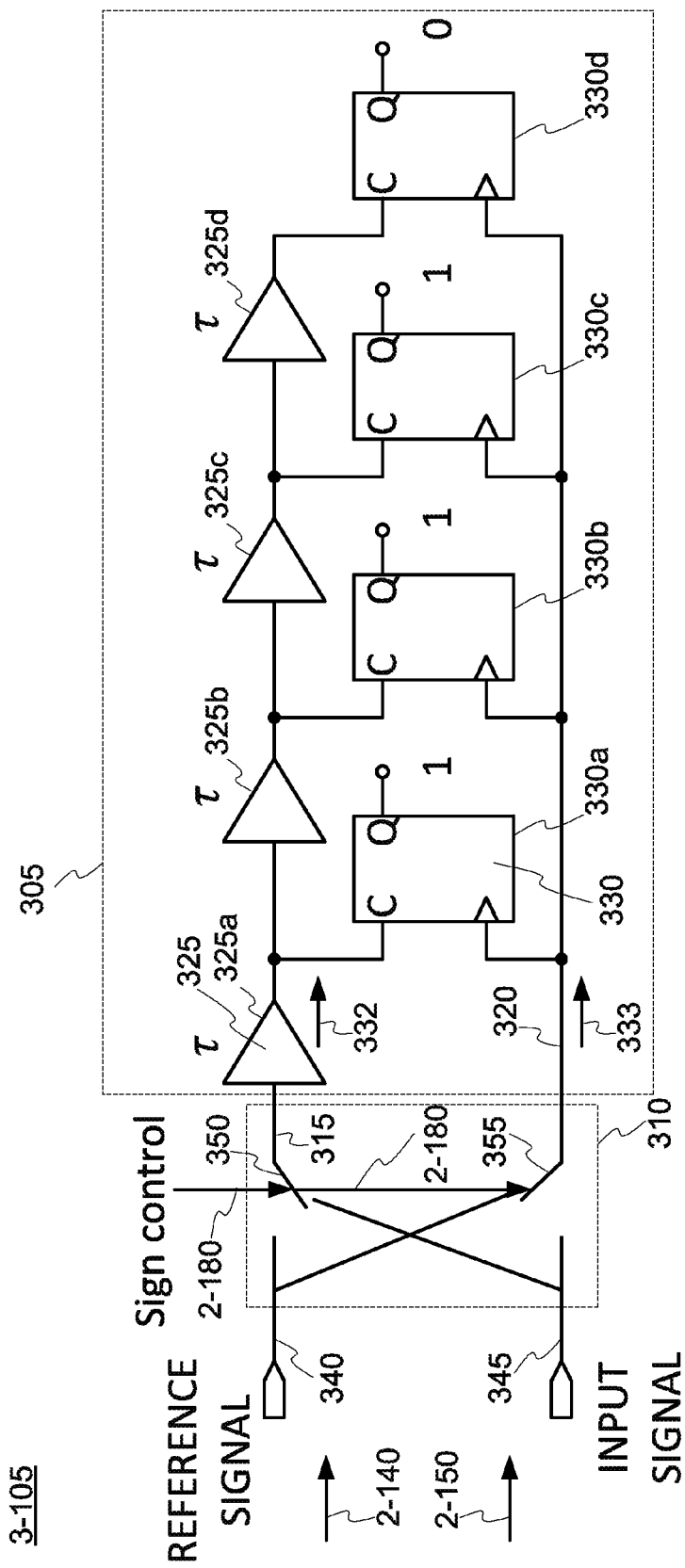
FIG. 3 illustrates a block diagram of a time to digital converter (TDC) block according to an embodiment.

FIG. 3 illustrates a block diagram of a time to digital converter (TDC) block 3-105 according to an embodiment of the disclosure. This TDC block 3-105 may be used in, for example, the fractional digital PLL 101 of FIG. 1B or in another type of system(s). In an embodiment, the TDC block 3-105 includes a time to digital converter (TDC) 305 and an input network 310 that is coupled to the TDC 305. The TDC 305 includes a first line 315 (or first signal path 315) and a second line 320 (or second signal path 320). A plurality of delay elements 325 are coupled to the first line 315. For example, the delay elements 325a, 325b, 325c, and 325d are each coupled to the first line 315. However, the number of delay elements 325 that are coupled to the first line 315 can be less than or greater than four. Each delay element 325 provides a predetermined delay value (r) to a signal that transmits through the delay element 325.

A plurality of memory elements 330 (or storage elements 330) is coupled to the first line 315 and to the second line 320. The memory elements 330 are, for example, flip-flops 330, comparators, or the like. Each memory element 330 receives a signal 332 at a first input C and receives a signal 333 at a second input 327. The signals 332 and 333 transmit along the first and second signal paths 315 and 320, respectively. Each memory element 330 outputs an output digital value 328 at an output Q. By way of example and not by way of limitation, the memory elements 330a, 330b, 330c, and 330d are each coupled to the first signal path 315 and to the second signal path 320. In an embodiment, the total number of storage elements 330 corresponds to the total number of delay elements 325. In the example shown in FIG. 3, there are four memory elements 330 and four delay elements 325. The memory elements 330 can, for example, store the state of the delay elements 325 as a thermometric code. It is noted that the TDC architecture in FIG. 3 is one example of an architecture for generating time delay values between signals.

The TDC 305 can function as a thermometric code memory that stores thermometric code at sampling instants given by a common clock signal such as a clock signal 2-150 (or input signal 2-150) from the multi module divider 1-125 (see FIG. 1B). The common clock signal allows the storage of the state (represented by the thermometric code) of the TDC 305 in a memory (not shown). The resolution of a state of a single TDC 305 can equal the time delay (r) of each delay element 325 in the first signal path 315. An encoder (not shown) can accept the data output (Q) of each memory element 330 and can encode the thermometric code as a binary output word. The binary output word can represent the time difference between the reference signal 2-140 and the input signal 2-150. The maximum delay that may be represented or measured by the single TDC 305 can equal the product of the delay (r) of a single delay element 325 multiplied by the number of delay elements 325. The single TDC 305 is also similarly described in commonly-owned and commonly-assigned U.S. Pat. No. 7,888,973, the contents of which is incorporated by reference herein in its entirety.

However, as discussed below, the input network 310 is configured to switch the signals 2-140 and 2-150 through the signal paths 315 and 320 in order to permit detection of positive delays and negative delays between the reference signal 2-140 and the input signal 2-150. For example, in a first switched state of the input network 310, the signal 332 traveling along the first signal path 315 is the reference signal 2-140, and the signal 333 traveling along the second signal path 320 is the input signal 2-150. The reference signal 2-140 is delayed by the delay elements 325. A positive time delay between the reference signal 2-140 and the input signal 2-150 is measured by the TDC 305.

In a second switched state of the input network 310, the signal 332 traveling along the signal path 315 is the frequency-divided feedback signal 2-150, and the signal 333 traveling along the signal path 320 is the reference signal 2-140. Accordingly, the input signal 2-150 is delayed by the delay elements 325 instead of the reference signal 2-140. A negative time delay between the reference signal 2-140 and the input signal 2-150 is measured by the TDC 305. The sign value of the control signal 2-180 determines whether the input network 310 will be in the first switched state or the second switched state.

The input network 310 includes a first input signal path 340 for receiving the reference signal 2-140 and a second input signal path 345 for receiving the input signal 2-150. The input network 310 also includes the switches 350 and 355 that connect the input signal paths 340 and 345 to the first signal path 315 and the second signal path 320 and that are controlled by the sign value 2-180. For example, when the sign value 2-180 is at a first value (e.g., a negative value which indicates a negative delay or the input signal 2-150 is lagging the reference signal 2-140), then the sign value 2-180 will: (1) configure the switch 350 to connect the first input signal path 340 to the first line 315 so that the reference signal 2-140 transmits from the first input signal path 340 to the first signal path 315, and the reference signal 2-140 will be the signal 332 along the first signal path 315, and (2) configure the switch 355 to connect the second input signal path 345 to the second signal path 320 so that the input signal 2-150 transmits from the second input signal path 345 to the second signal path 320, and the input signal 2-150 will be the signal 333 along the second line 320. Since the input signal 2-150 is leading the reference signal 2-140, there is a positive delay which is reflected by a positive value of the sign value 2-180. The switches 350 and 355 may be, for example, any suitable switches such as transistor switches or signal relays.

As another example, when the sign value 2-180 is at a second value (e.g., a positive value which indicates a positive delay or the input signal 2-150 is leading the reference signal 2-140), then the sign value 2-180 will: (1) configure the switch 350 to connect the second input signal path 345 to the first signal path 315 so that the input signal 2-150 transmits from the second input signal path 345 to the first signal path 315, and the input signal 2-150 will be the signal 332 along the first line 315, and (2) configure the switch 355 to connect the first input signal path 340 to the second signal path 320 so that the reference signal 2-140 transmits from the first input signal path 340 to the second signal path 320, and the reference signal 2-140 will be the signal 333 along the second line 320. Since the input signal 2-150 is lagging the reference signal 2-140, there is a negative delay which is reflected by a negative value of the sign value 2-180.

Figure 4:
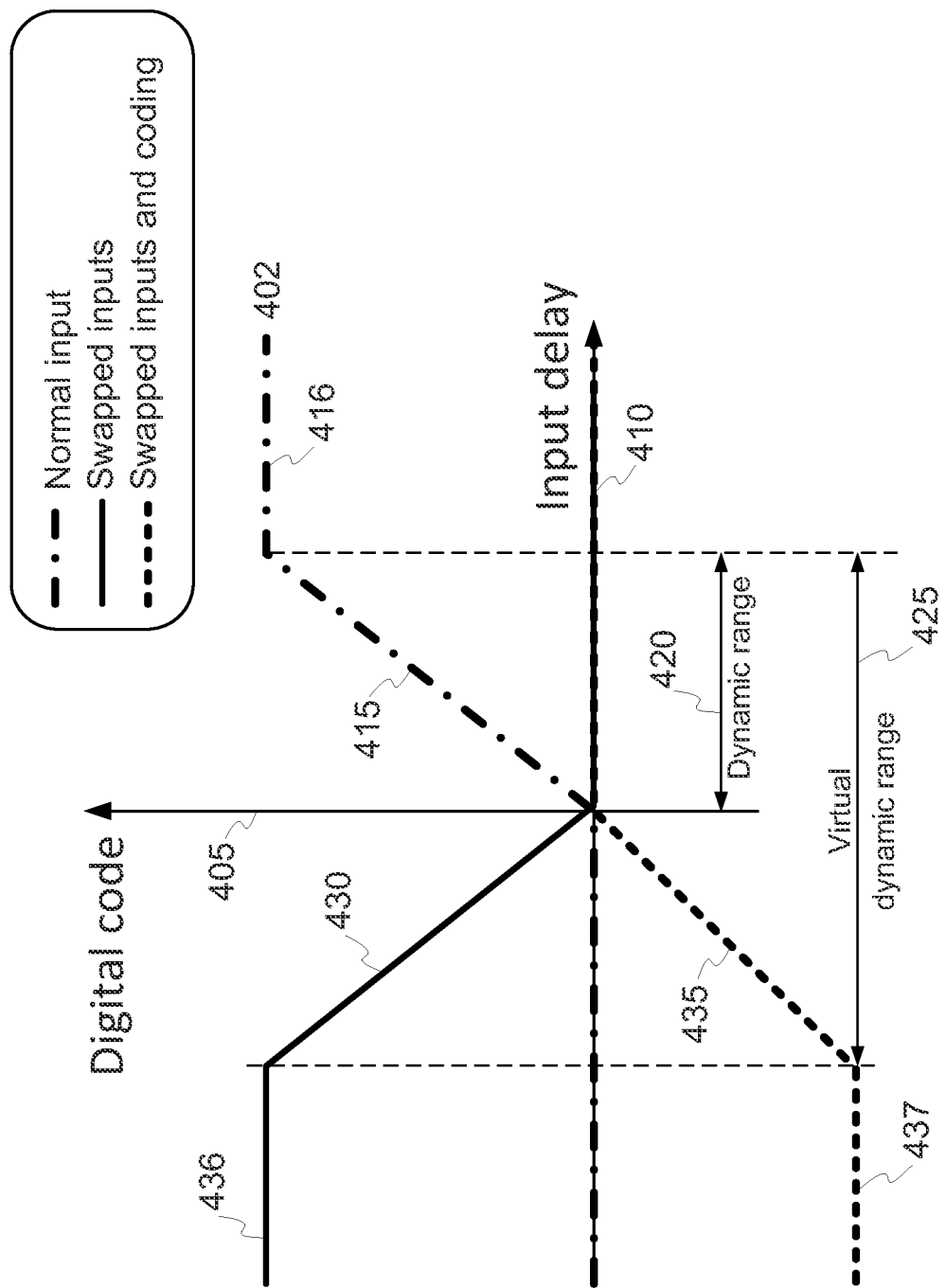
FIG. 4 illustrates a diagram of the output characteristics of the TDC block of FIG. 3 according to an embodiment.

FIG. 4 illustrates a diagram of the output characteristics of the TDC block 3-105 of FIG. 3 according to an embodiment of the disclosure. The digital code values 402 measured along the Y-axis 405 versus input delay values measured along the X-axis 410, where the digital code values 402 may be, for example, thermometric code values and the input delay values is the range of the time differences between the input signal 2-150 and the reference signal 2-140. The digital code values 402 correspond to the digital code values 1-155 (see FIG. 1B) and are a function of input delay values. As discussed above, an input delay value can be a positive delay or a negative delay. The TDC 3-105 can produce a digital code value 402 that is measured along the Y-axis 405 and is represented by the output signal 1-155 in FIG. 1, and is also represented by, for example, the thermometric code that indicates the state of the delay elements 325 and that is stored in the memory elements 330. The digital code value 402 (measured along the Y-axis 405) increases linearly along the linear waveform portion 415 as the input delay (measured along the X-axis 410) increases over a range of time differences called the dynamic range (DR) 420. The digital code value 402 then remains substantially constant along the waveform portion 416 as the input delay increases further in positive values. As an example, the DR 420 is proximate to the period of the oscillatory output signal 1-135 (see FIG. 1B) of the DCO 1-120.

In an embodiment, the dynamic range 420 can be approximately doubled in a range so that the dynamic range 420 will be increased to a virtual dynamic range 425. The digital multiplier 1-110 (see FIG. 1B) will multiply the sign value 2-180 with the digital code value 402 (digital code values 1-155 in FIG. 1B) from the TDC block 1-105. When the input delay is a negative delay, the digital code values 402 are represented by a linear waveform portions 430 and a constant waveform portion 436. When the input delay is negative, the multiplier 1-110 (FIG. 1B) will multiply the negative value of the sign value 2-180 with the digital code value 1-155 (see FIG. 1B) so that this multiplication will swap the positive linear value along the portion 430 into the negative linear value along the portion 435 for the digital code value 402 along the Y-axis 405. This multiplication function of the multiplier 1-110 will also swap the substantially constant positive value of the digital code value 402 along the portion 436 into the substantially constant negative value of the digital code value 402 along the portion 437. Therefore, the sign swap performed by the multiplier 1-110 could "virtually" double the dynamic range 420 to the virtual dynamic range 425, in accordance with an embodiment of the disclosure. The term "virtually" means that the TDC block 3-105 can be reconfigured to digitalize the input delays over a wider range including positive and negative delays. In an embodiment, the virtual dynamic range 425 that has a greater range than the dynamic range 420 is obtained while maintaining the area consumption and power consumption of hardware substantially the same as a conventional TDC block that digitalizes input delays over a range including the positive delays.

Figure 5:
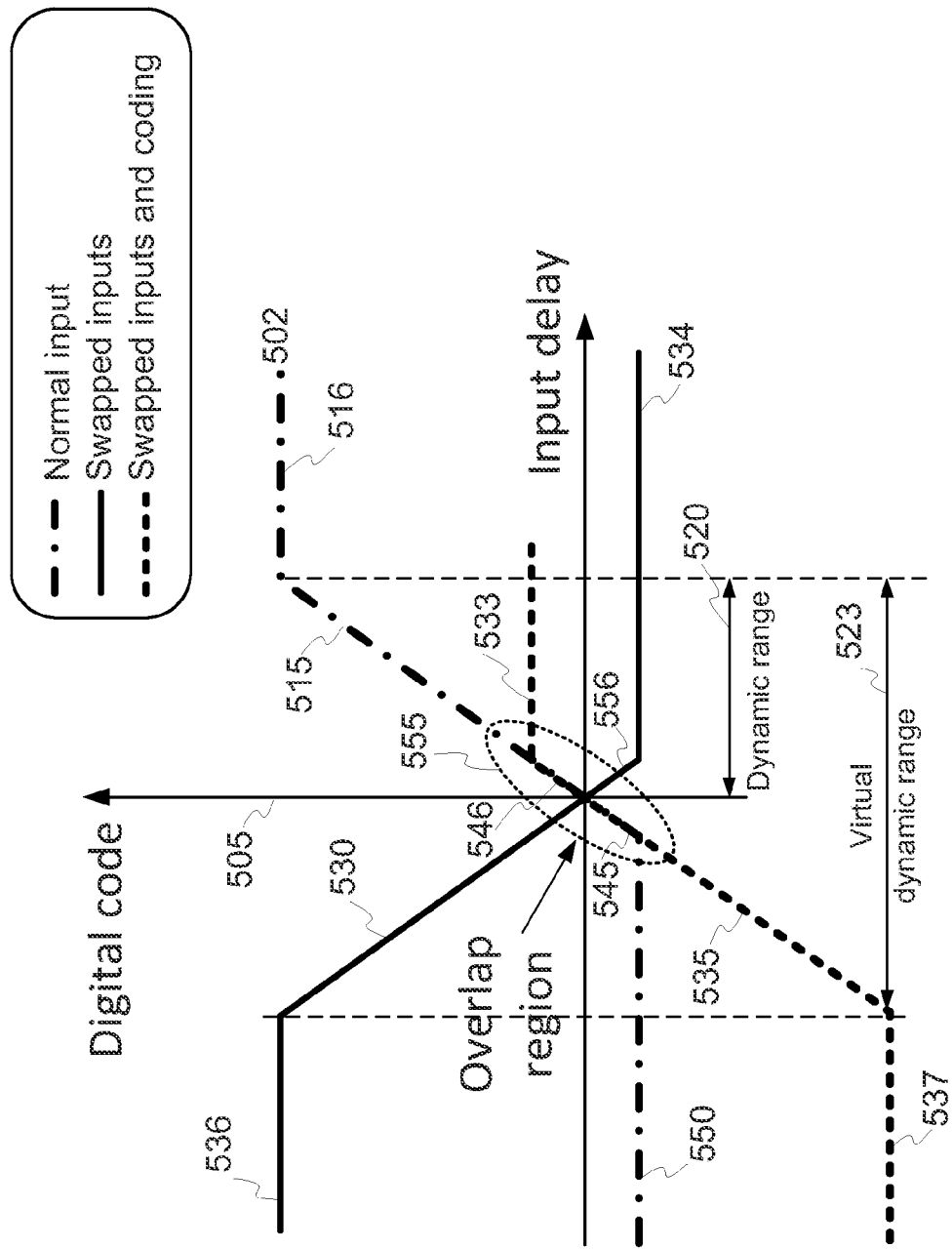
FIG. 5 illustrates another diagram of the output characteristics of the TDC block of FIG. 3 according to an embodiment.

FIG. 5 illustrates a diagram of the output characteristics of the TDC block of FIG. 3 according to another embodiment. The waveform 502 indicates digital code values 502 that represent positive or negative input delays in the presence of noise that cannot be predicted with certainty. When the input delay is positive, the digital code values 502 have the positive linear values 515, positive constant values 516, small negative linear values 545, and negative constant values 550. When the input delay is negative, the switching input and swapping output operations described above are performed so that the digital code values 502 have negative constant values 537, negative linear values 535, small positive linear values 546, and constant positive values 533, respectively.

Since the small negative linear values 545 overlaps with the negative linear values 535, the small negative linear values 545 can be measured using the switching input and swapping output operations described above. Alternatively, the small negative linear values 545 can be also measured without using the switching and swapping operations. Similarly, the small positive linear values 546 can be measured either with or without performing the switching input and swapping output operations. As a result, negative and positive input delays in an overlap region 555 including the small negative and positive linear values 545 and 546 can be converted into the digital code values 502 in an overlap region 555 using the different schemes. As stated above, in a fractional PLL, the phase error is composed of fractional errors and jitter. The value of fractional errors is typically larger than the value of jitter in a fractional digital PLL. Since fractional errors are deterministic, these errors can be predicted. However, jitter may be unpredictable. Having an overlap region may allow avoiding errors if the prediction of the sign is wrong (for example, if at a certain time the fractional error is zero, only jitter will determine the sign of the TDC input signal).

Figure 6:
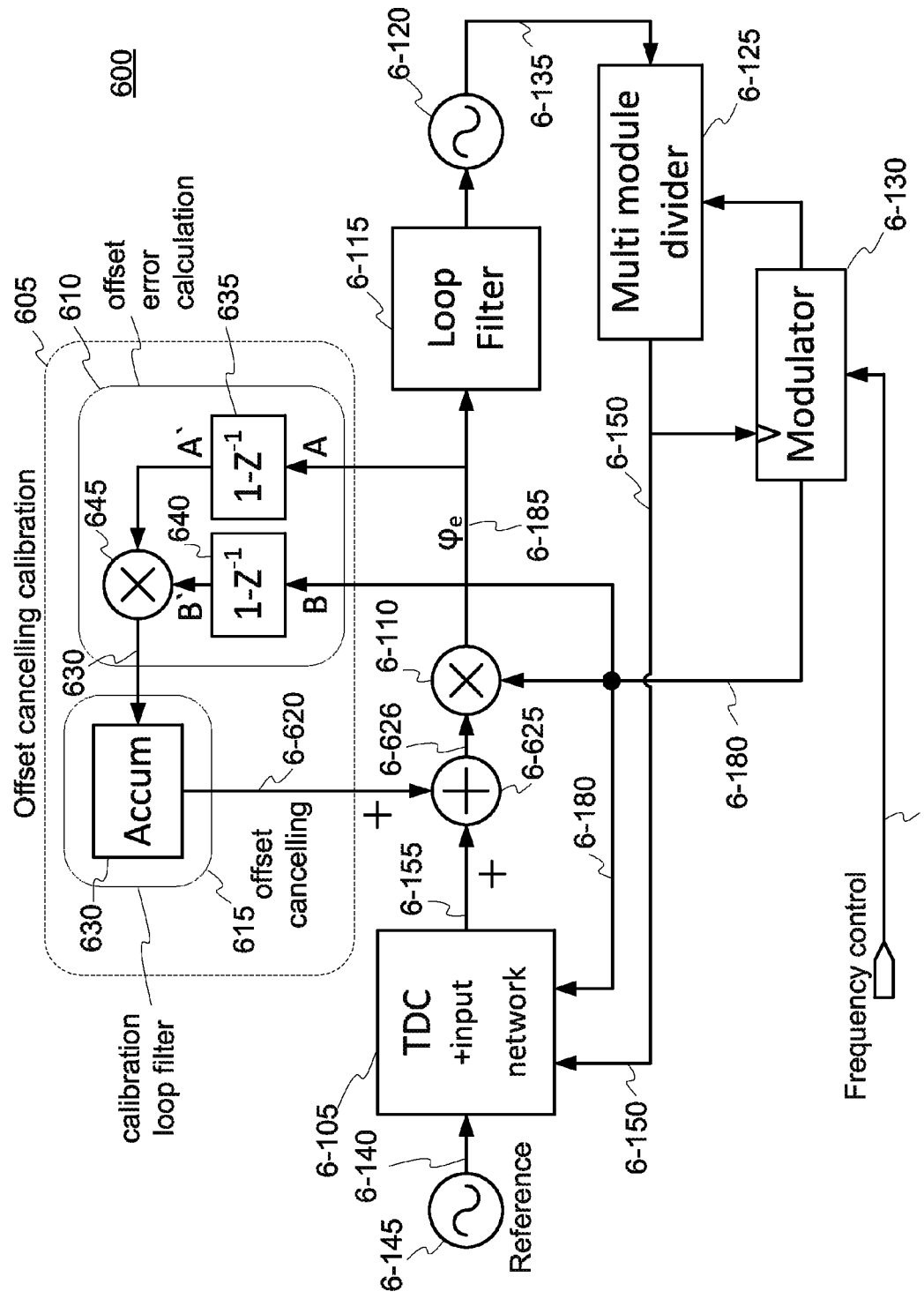
FIG. 6 illustrates a block diagram of a digital phase-locked loop (PLL) according to an embodiment.
Figure 7:
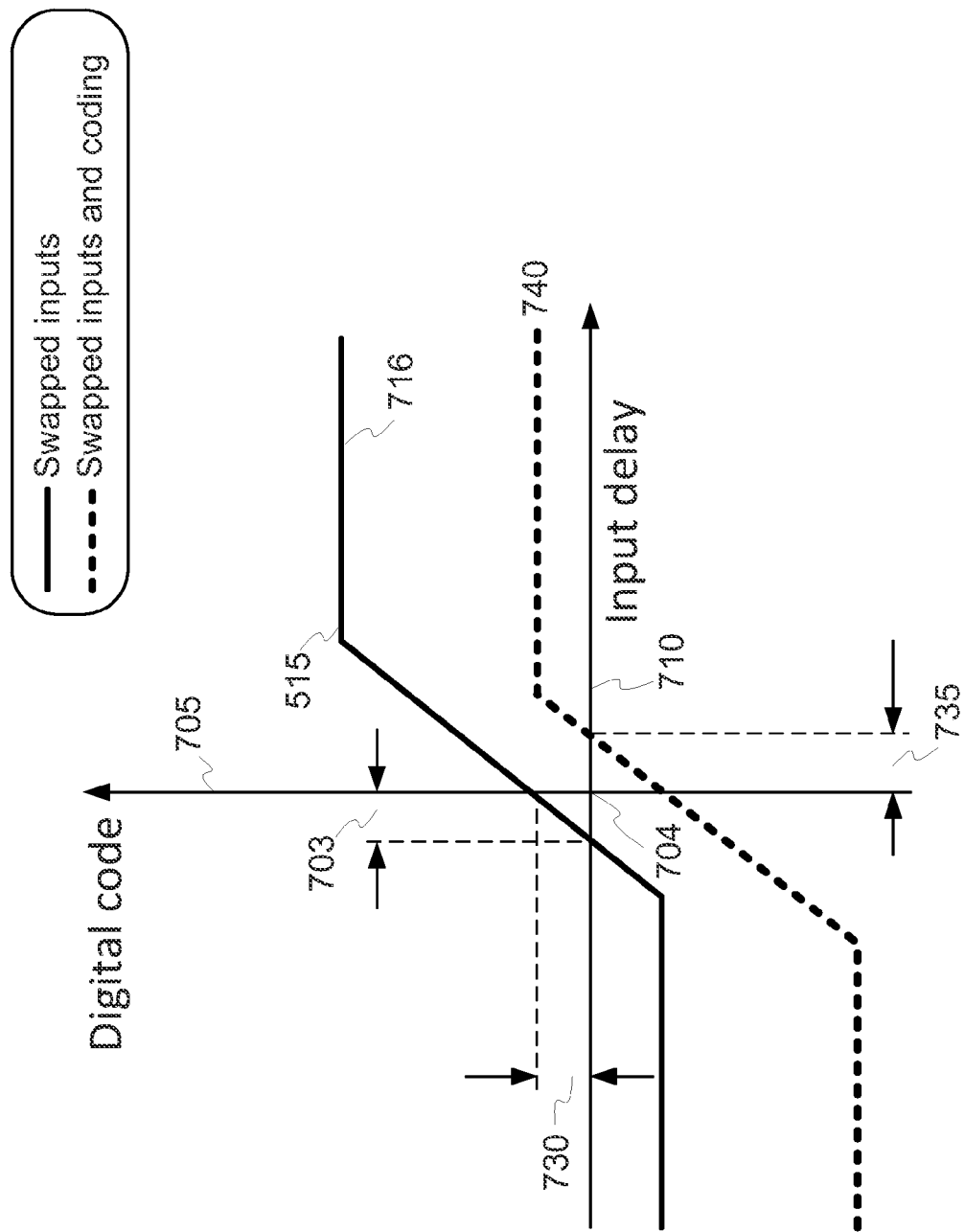
FIG. 7 illustrates a diagram of the output characteristics of a TDC block, with a TDC offset occurring in the output characteristics.
Figure 8:
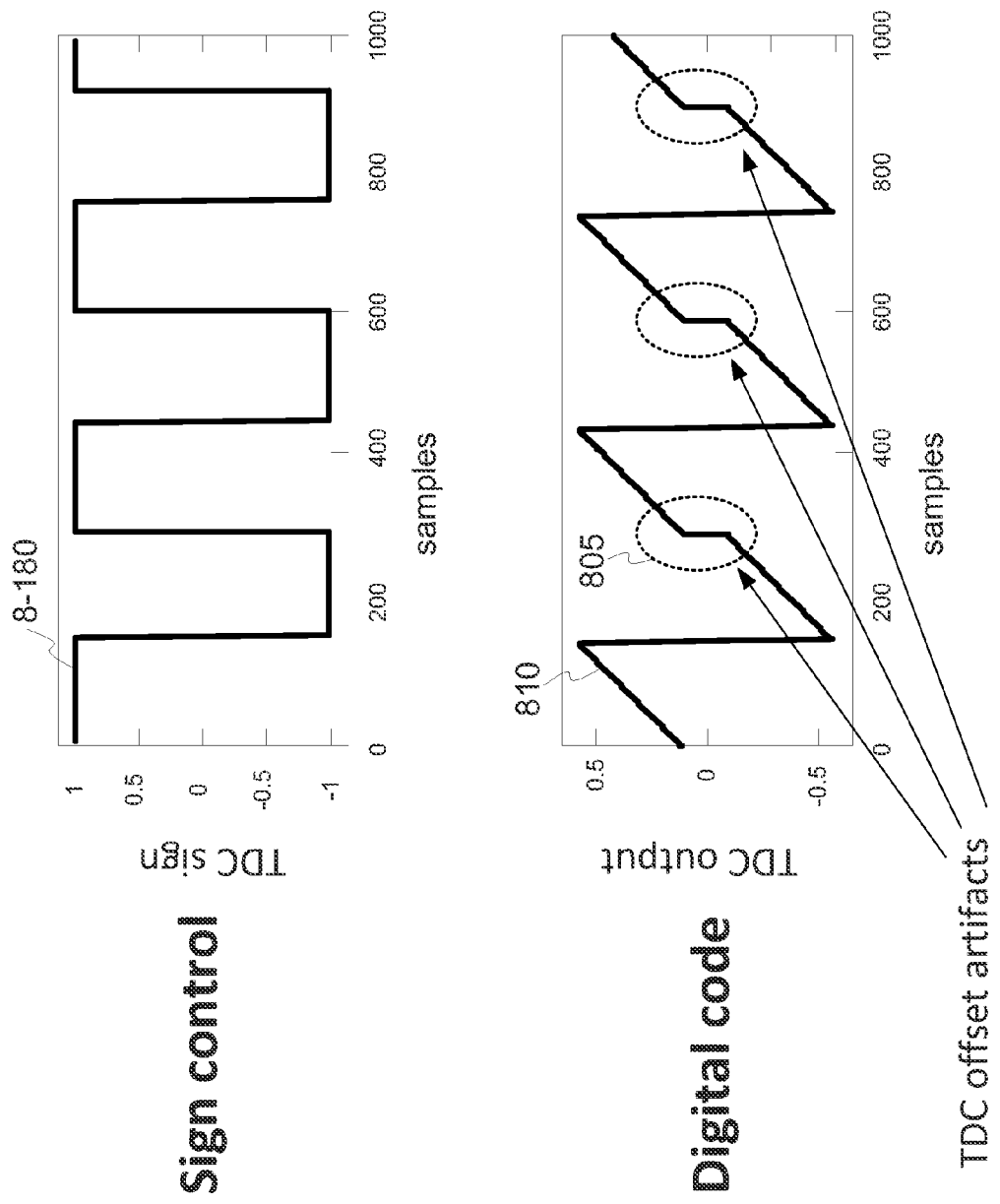
FIG. 8 illustrates a diagram of digital code values with TDC offset artifacts.

FIG. 6 illustrates a block diagram of digital phase-locked loop (PLL) 600 according to an embodiment of the disclosure. The digital PLL 600 includes the time to digital converter (TDC) block 6-105, a digital multiplier 6-110, a digital loop filter 6-115, a digitally controlled oscillator (DCO) 6-120, a multi module divider 6-125, and a modulator 6-130. FIG. 7 illustrates a diagram of output characteristics of the TDC block 6-105 of FIG. 6 according to an embodiment. The output characteristics are illustrated with a TDC offset 703 (or offset 703) of the digital code values 6-155. FIG. 8 illustrates a diagram of digital code values 1-155 with TDC offset artifacts 805 according to an embodiment.

In an embodiment, the PLL 600 includes an offset cancelling calibration block 605 (or offset calibration block 605) that provides compensation for a TDC offset 703 (see FIG. 7). The TDC offset 703 horizontally shifts the digital code values 716 to the left of the origin 704. The digital code values 740, which are obtained after performing the switching input and swapping output operations on the digital code values 716, horizontally shifts to the right of the origin 704 by a TDC offset 735. Digital code values 810 correspond to the digital code values 716 and the digital code values 740 when the input delay is positive and negative, respectively, and will have unwanted artifacts 805 at the origin 704, as shown in FIG. 8. These TDC offset artifacts 805 may negatively affect the linearity of the output characteristics of the TDC block 6-105. Therefore, the offset cancelling calibration block 605 (FIG. 6) cancels the TDC offset 703 so that offset cancelling calibration block 605 will move the waveform 716 (digital code values 716) vertically downward. The waveform 716 is made to cross the origin 704, and the TDC offset 703 for the waveform 716 is removed.

In an embodiment, the offset cancelling calibration block 605 includes an offset error calculation block 610 and a calibration loop filter 615. The offset cancelling calibration block 605 outputs an offset cancelling signal 6-620 to a digital adder 6-625. The digital code values 6-155 and the offset canceling signal 6-620 are added by the digital adder 6-625, so that the waveform 716 (that represents the digital code values 6-155) is made to cross the origin 704 and remove the TDC offset 703. Therefore, the digital adder 6-625 adds the positive or negative values of the offset cancelling signal 6-620 to the digital code value 6-155, so that the digital adder 6-625 can move the digital code value 6-155 vertically upward or downward to cancel the TDC offset 703. The digital adder 6-625 outputs the digital code value 6-626 (which does not have a TDC offset). A digital multiplier 6-110 multiplies the digital code value 6-626 with the sign value 6-180 and generates the modified time delay code value (A) 6-185.

In an embodiment, the calibration loop filter 615 is an accumulator 630 and the offset error calculation block 610 includes a first digital filter 635, a second digital filter 640, and a digital multiplier 645. In an embodiment, each of the filters 635 and 640 has the first order transfer function $H(z) = 1 - z^{-1}$. However, filters of a higher order may be used for the filters 635 and 640 in order to reduce the impact of jitter for the offset error calculation that is performed by the offset cancelling calibration block 605.

In an embodiment, the first filter 635 receives the phase error A (phase error 6-185) which is the time delay between the input network signal 6-150 and the reference signal 6-140, and the second filter 640 receives the input network control signal B (sign value 6-180) which is the sign control signal for controlling the input network 310 (FIG. 3). The first filter 635 filters the phase error A and generates an increment value (A'), which is a difference between phase errors A at two consecutive sampling times. The second filter 640 filters the input network control signal B and generates an increment values (B'), which is a difference between input network control signals B at two consecutive sampling times. The digital multiplier 645 will multiply the increment value B' with the increment value A'. A sum of the multiplied values A'*B' in the accumulator 630 has a value proportional to the magnitude of the TDC artifacts 805, so that the accumulator 630 provides the offset cancelling signal 6-620 to the adder 6-626. As a result, the negative effects of the TDC offsets 703 and 735 on the linearity of the output characteristics of the TDC block 6-105 is reduced.

In another embodiment, the first digital filter 635 and the second digital filter 640 are omitted in the offset error calculation block 610. Therefore, the digital multiplier 645 multiplies the phase error A with the input network control signal B. Since the phase error A corresponds to the digital code values 810 and the input network control signal B corresponds to the signal values 8-180, the multiplied values A*B have absolute values of the digital code values 810 including the artifacts 805. When the magnitude of the artifacts 105 increases, a sum of the multiplied values A*B in the accumulator 630 also increases. The accumulator 630 then generates the offset cancelling signal 620 based on the digital multiplier output 660. The filters 635 and 640 can be used to improve the stability of the calibration system. However, in some embodiments, the use of the filters 635 and 640 can be avoided and/or the filters 635 and 640 are omitted.

Figure 9:
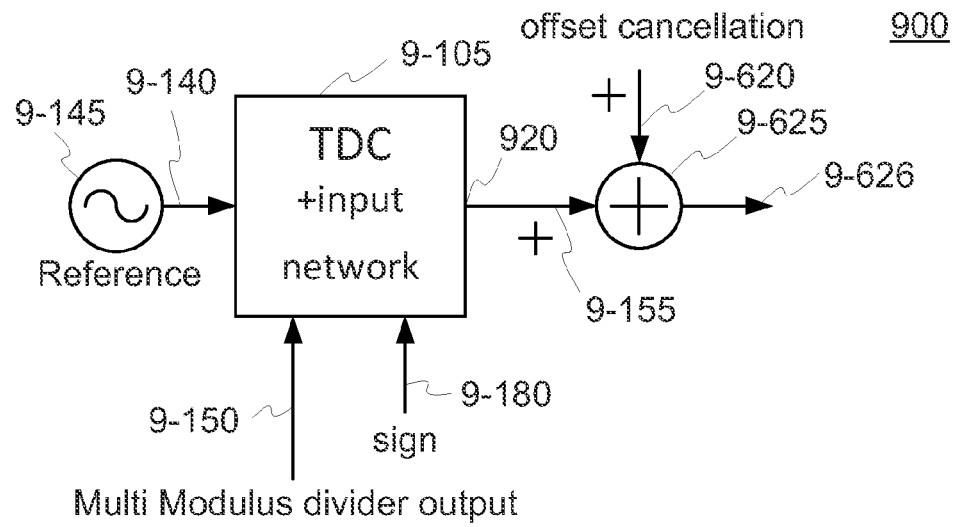
FIG. 9 is a block diagram that shows a digital offset cancellation logic in the PLL of FIG. 6 according to an embodiment.

FIG. 9 illustrates a block diagram that shows a digital offset cancellation logic 900 in the PLL 600 of FIG. 6 according to an embodiment of the disclosure. As shown, the digital adder 9-625 is coupled to the output 920 of the TDC block 9-105 (or to the output of the TDC 305 in FIG. 3). As similarly discussed above, the digital adder 9-625 adds the offset cancelling signal 9-620 (or offset calibration signal 9-620) with the TDC block output 9-155 (digital code value 9-155) and generates the digital adder output signal 9-626. The offset cancelling signal 9-620 moves the waveform 716 vertically upward or vertically downward to cancel the TDC offset in the output signal 10-626, so that the waveform 716 crosses the origin 704. As discussed above, the digital adder 9-625 adds positive or negative values to the waveform 716 to cancel the offset 703.

Figure 10:
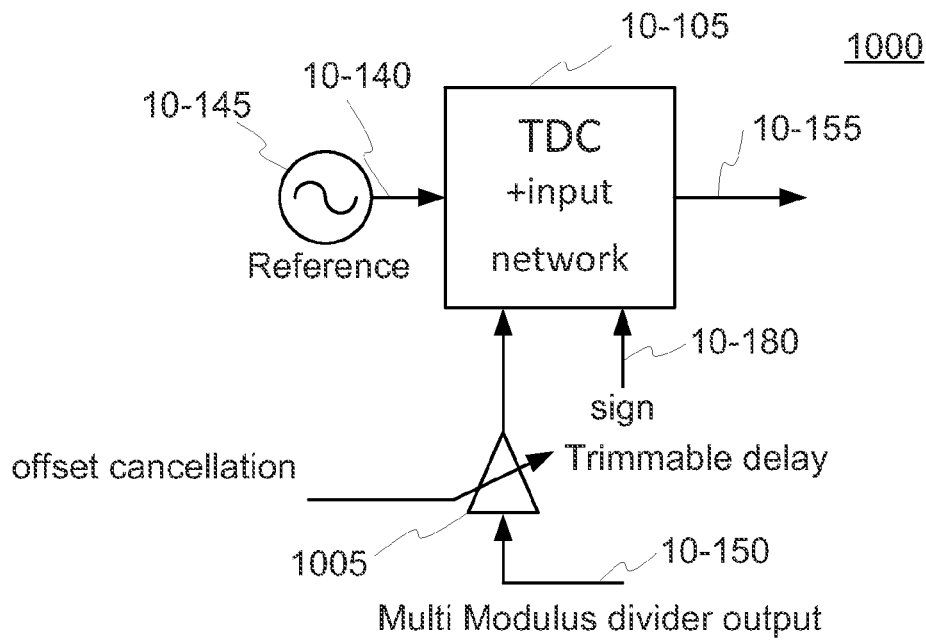
FIG. 10 illustrates a block diagram that shows an analog offset cancellation stage in the PLL of FIG. 6 according to an embodiment.

FIG. 10 illustrates a block diagram that shows an analog offset cancellation stage 1000 in the PLL 600 of FIG. 6 according to an embodiment of the disclosure. The analog offset cancellation stage 1000 includes a trimmable delay block 1005 (or adjustable delay block 1005) which allows adjustment of the delay in the multi module divider output 10-150 so that the time delay between the reference signal 10-140 and the multi module divider output 10-105 is adjustable. As shown, the adjustable delay block 1005 is coupled to the TDC block 10-105 (or to the second input path 345 of the input network 310 in FIG. 3). The adjustment in this time delay between the reference signal 10-140 and the divider output 10-150 shifts the waveform 716 horizontally forward or horizontally backward in order to cancel the TDC offset in the output signal 10-155, so that the waveform 716 will cross the origin 704. Therefore, the adjustable delay block 1005 adjusts the phase of the multi module divider output 10-150 horizontally leftward or horizontally rightward along the X-axis 710 (FIG. 7).

Figure 11:
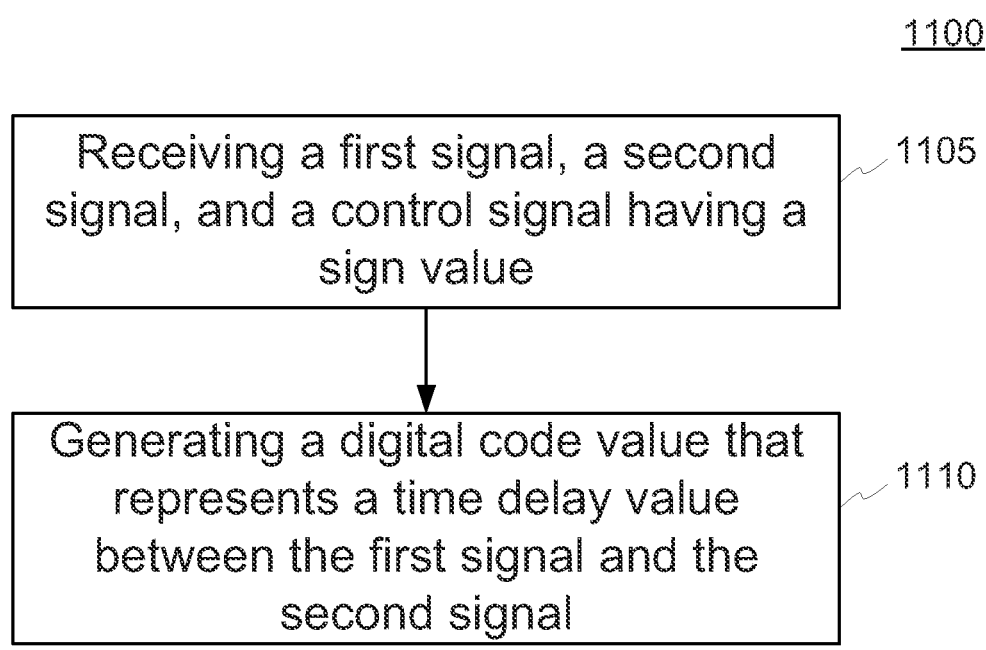
FIG. 11 illustrates a flowchart showing a method of increasing the dynamic range of a TDC according to an embodiment.

FIG. 11 illustrates a flow diagram of a method 1100 according to an embodiment of the disclosure. The method 1100 increases the dynamic range of a time to digital converter. At 1105, a first signal, a second signal, and a control signal having a sign value are received. At 1110, a digital code value is generated. The digital code value represents a time delay value between the first signal and the second signal, wherein a switching of the first signal and second signal is performed in response to the sign value that is determined by the time delay between the first signal and the second signal.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An apparatus comprising:
an input network configured to receive a first signal, a second signal, and a control signal having a sign value; and
a time-to-digital converter (TDC) configured to generate a digital code value that represents a time delay value between the first signal and the second signal,
wherein the input network is configured to switch where the first signal and second signal are output in response to the sign value that is determined by the time delay value between the first signal and the second signal.

2. The apparatus of claim 1, wherein the input network comprises a first input signal path transmitting the first signal, a second input signal path transmitting the second signal, a first switch, and a second switch,
wherein the first switch is coupled to the first input signal path and the second switch is coupled to the second input signal path if the sign value is at a first value, and
wherein the first switch is coupled to the second input signal path and the second switch is coupled to the first input signal path if the sign value is at a second value.

3. The apparatus of claim 1, wherein the TDC comprises a first signal path, a second signal path, a plurality of delay elements coupled to the first signal path, and a plurality of memory elements coupled to the first signal path and to the second signal path.

4. The apparatus of claim 3, wherein the plurality of memory elements comprises flip-flops.

5. The apparatus of claim 3, wherein the input network is configured to transmit the first signal to the first signal path if the sign value is at a first value and to transmit the second signal to the second signal path if the sign value is at the first value, and
wherein the input network is configured to transmit the second signal to the first signal path if the sign value is at a second value and to transmit the first signal to the second signal path if the sign value is at the second value.

6. The apparatus of claim 5, further comprising:
a multiplier coupled to an output of the TDC and configured to receive the sign value to generate a modified time delay code,
wherein the modified time delay code is a multiplied value of the sign value with the digital code value.

7. The apparatus of claim 1, wherein the apparatus is a phase-locked loop circuit (PLL).

8. The apparatus of claim 7, wherein the PLL is a fractional PLL, further comprising a sign generator configured to receive a fractional error of the fractional PLL and generate the sign value based on the fractional error.

9. The apparatus of claim 1, further comprising:
an offset calibration block coupled to an output of the TDC and configured to provide an offset calibration signal to a digital adder; and
the digital adder coupled to the output of the TDC and to the offset calibration block,
wherein the digital adder is configured to reduce an offset in the digital code value.

10. The apparatus of claim 9, further comprising:
an adjustable delay block coupled to the input network and configured to adjust a phase of the second signal to reduce the offset in the digital code value.

11. A method comprising:
receiving a first signal, a second signal, and a control signal having a sign value; and
generating a digital code value that represents a time delay value between the first signal and the second signal;
switching and outputting the first signal and second signal in response to the sign value that is determined by the time delay value between the first signal and the second signal.

12. The method of claim 11, wherein the switching comprises:
coupling a first input signal path that transmits the first signal to a first switch and coupling a second input signal path that transmits the second signal to a second switch if the sign value is at a first value, and
coupling the first input signal path to the second switch and coupling the second input signal path to the first switch if the sign value is at a second value.

13. The method of claim 11, wherein the digital code value is generated using a time to digital converter (TDC), the TDC including a first signal path, a second signal path, a plurality of delay elements coupled to the first signal path, and a plurality of memory elements coupled to the first signal path and to the second signal path.

14. The method of claim 13, further comprising:
transmitting the first signal to a first signal path of the TDC if the sign value is at a first value and transmitting the second signal to a second signal path of the TDC if the sign value is at the first value; and
transmitting the second signal to the first signal path if the sign value is at a second value and transmitting the first signal to the second signal path if the sign value is at the second value.

15. The method of claim 14, further comprising multiplying the digital code value with the sign value to generate a modified time delay code.

16. The method of claim 11, wherein the digital code value represents the time delay value between the first signal and the second signal and the digital code value is used to maintain the time delay value below a threshold value in a PLL.

17. The method of claim 16, wherein the PLL is a fractional PLL, and
wherein the sign value is determined using a fractional error of the fractional PLL.

18. The method of claim 11, further comprising:
providing an offset calibration signal to a digital adder, the offset calibration signal being proportional to an offset in the digital code value; and
reducing the offset by adding the offset calibration signal to the digital code value.

19. The method of claim 18, further comprising:
adjusting a phase of the second signal to reduce the offset in the digital code value.

* * * * *